United States Patent [19]
Goldman et al.

[11] 3,934,067
[45] Jan. 20, 1976

[54] LAMINAR STRUCTURE HAVING AN IMPREGNATED FIBROUS WEB

[75] Inventors: Ira Bernard Goldman, Princeton Township, Mercer County, N.J.; John Francis Henrickson, Richmond, Va.

[73] Assignee: Western Electric Company, Inc., New York, N.Y.

[22] Filed: July 17, 1974

[21] Appl. No.: 489,282

[52] U.S. Cl. .............. 428/290; 427/96; 427/123; 428/416; 428/480; 428/901; 428/296; 428/260
[51] Int. Cl.² .............. B32B 27/38; B32B 15/08
[58] Field of Search .......... 117/212, 160 R, 161 ZB, 117/161 K; 161/231, 184, 186, 188, 214, 88, 161/92, 93, DIG. 4, DIG. 7; 428/414, 416, 420, 458, 901

[56] References Cited
UNITED STATES PATENTS

| | | | |
|---|---|---|---|
| 3,027,279 | 3/1962 | Kurka et al. | 117/232 |
| 3,036,948 | 5/1962 | Danielson | 161/231 X |
| 3,493,414 | 2/1970 | Hastings | 117/161 ZB |
| 3,649,475 | 3/1972 | Degnan et al. | 117/212 |
| 3,654,097 | 4/1972 | Degnan | 117/212 |

Primary Examiner—George F. Lesmes
Assistant Examiner—R. J. Roche
Attorney, Agent, or Firm—J. Rosenstock

[57] ABSTRACT

A method of improving the dimensional and thermal stability of a fibrous web containing substrate is disclosed. A uniformly or randomly spun or bonded fabric or textile support is impregnated with a curable polymer resin, e.g., an epoxy-polyester resin. The impregnated resin is then fully cured whereupon a polymer resin coat is applied thereto. The coat is maintained in a partial cure state whereby a laminate comprising an internal woven or bonded fabric skeleton impregnated with a fully cured polymer resin and coated with a layer of a partially cured polymer resin is obtained.

4 Claims, 2 Drawing Figures

3,934,067

LAMINAR STRUCTURE HAVING AN IMPREGNATED FIBROUS WEB

BACKGROUND OF THE INVENTION

1. Field of the Invention

This invention relates to a method of improving the dimensional and thermal stability of a fibrous web containing substrate and more particularly, to a method wherein the fibrous web is impregnated with a polymer resin cured to a state or stage of full cure and then coated with a polymer resin cured to a state or stage of partial cure.

2. Description of the Prior Art

Printed circuit boards as used in the electronic industry usually consist of a synthetic resin laminate base which is coated on one or both sides with a copper film. The copper acts as the conductor and can be replaced by other conductors and can be omitted in portions of the circuit where conductivity is not desired.

Most of the base materials heretofore in use consisted of laminates having a fibrous web internal skeleton into which polymeric material was impregnated and cured. Such materials were adequate when the circuit boards made therefrom were used for ordinary household goods such as radios and hearing aids. But, when as at present, it is desired to use such printed circuit techniques in precision electronic devices and components, many problems arise calling for particularly stable materials that will assure the reliability of these devices and components during operation under the rigors imposed by the mode and enviornment of use.

Most previously used materials exhibit the following shortcomings:

1. Their electrical properties change beyond tolerable limits with changes in ambient temperature and humidity.

2. Their dimensional stability varies with humidity, temperature and time, showing considerable warping or shrinkage.

3. They generally show poor machinability unles heavily plasticized, which thereby causes loss of important electrical characteristics such as dielectric qualities.

4. Their chemical resistance to many commonly used processing chemicals is limited, requiring that dip-soldering, plating, etching and similar operations be limited with respect to useful materials or mode of treatment.

Further, under many conditions of industrial use, the chemical, dimensional and electrical qualities of the previously used materials are destroyed or seriously compromised by ambient conditions such as extremes of heat, cold, humidity, bacteria and molds, oils, dusts and variations or combinations of such ambient conditions.

Fibrous web laminates useful for electric circuits and suitable for mass production of industrial and electronic apparatus should have excellent physical, chemical and electrical properties and they should be readily machinable and should be easily manufactured without cumbersome processing steps or equipment.

An adequate fibrous web skeletal laminate for printed circuits should have good dimensional stability and good thermal stability, as for example to soldering operations. A minimum dimensional and thermal stability for printed circuit boards is exhibited by shrinkage or growth of 1.0 mil/inch or less after exposure to a temperature of 121°C for 72 hours.

Improving dimensional stability and thermal stability with a fibrous web polymer laminate for printed circuits by maximizing the cure of the particular polymer system leads to problems of adhesion of a metallic conductive pattern thereto. For printed circuit manufacture a minimum peel strength of at least 5 lbs./linear inch is required. Such a peel strength is normally not possible with most fully cured polymer laminates such as epoxies, polyesters, polyimides, etc., which are metallized by additive electroless metal techniques.

Therefore, a method of improving the dimensional and thermal stability of a fibrous web containing substrate without diminishing its usefulness as a printed circuit material is desired. Also desired is a laminate for printed circuit board manufacture having good dimensional and thermal stability, as well as good adhesive properties with respect to metal deposited thereon.

SUMMARY OF THE INVENTION

This invention relates to a method of improving the dimensional and thermal stability of a fibrous web containing substrate and more particularly, to a method wherein the fibrous web is impregnated with a polymer resin cured to a state or stage of full cure and then coated with a polymer resin cured to a state or stage of partial cure.

The fibrous web is impregnated with a polymer resin which is then cured to a full cure stage. The fully cured resin impregnated web or core is then coated with a polymer resin, which may or may not be the same resin initially employed, to form a polymer resin coat thereon. The resin coat is then cured to a partial cure state or stage.

In a specific embodiment, an epoxy-polyester laminate is formed which comprises an internal skeleton comprising a fabric or textile support impregnated with a cured epoxy-polyester resin produced by interreacting (1) a branched-chain, acid-terminated polyester of dicarboxylic acid, dihydroxy alcohol and a polyfunctional compound selected from the class consisting of polyhydric alcohols having at least three nontertiary hydroxyl groups and polybasic acids having at least three carboxyl groups not more than one-half of the total of said acids and alcohols containing aromatic rings, which polyester contains an average of 2.1 to 3.0 carboxyl groups per molecule, has an acid number of 15 to 125, a hydroxyl number of less than 10, and is free from ethyleneic unsaturation in its skeletal chain; and (2) an epoxy compound containing on the average at least 1.3 groups readily reactive with the carboxyl group, at least one of which groups is the oxirane group, said groups being separated by a chain of at least two carbon atoms, the chain being free from ethylenic unsaturation, and cured to a state or stage of full cure. On at least a portion of the impregnated internal skeleton is a layer of the same epoxy-polyester material cured to a partial cure state or stage.

DETAILED DESCRIPTION

Figure 1:
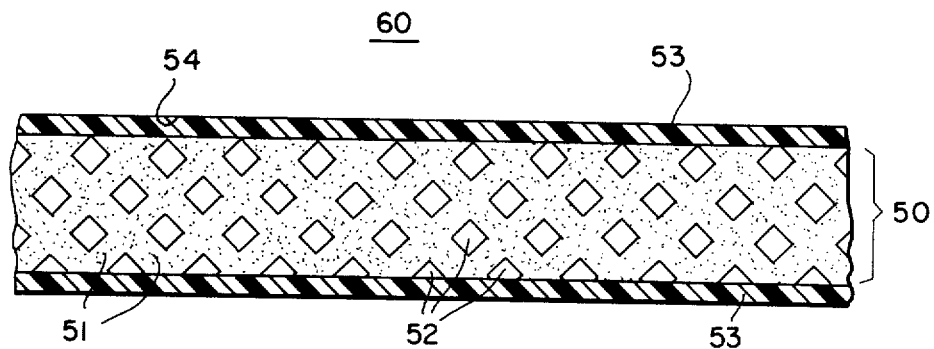
FIG. 1 is a partial cross-sectional view of a laminar structure comprising a fabric or textile support, impregnated with a polymer resin cured to a final cure stage and coated with a polymer resin cured to a partial cure stage.

Referring to FIG. 1, a support or substrate 50 is selected comprising a woven or bonded web, sheet or layer having interlacing strands or fibers 51. The support may comprise either natural fibers or synthetic fibers, such natural and synthetic fibers being well known in the art to one skilled therein. Some typical suitable fibers include (1) siliceous material, e.g., fibers of fiberglass, quartz, asbestos, silica, etc.; (2) cellulosic material, e.g., fibers of cotton, etc.; (3) regenerated cellulose, e.g., cellulose fibers formed from a solution such as viscose rayon, cuprammonium rayon, deacetylated cellulose acetate, denitrated nitro-silk, etc.; (4) low-substituted cellulose derivatives, e.g., fibers of hydroxy ethyl cellulose, methyl cellulose, etc.; (5) polyester material (polyethyleneterephthalate fibers), e.g., Dacron a trademarked polyester fiber of E. I. DuPont de Nemours and Co., Reemay a trademarked polyester random weave fabric of E. I. DuPont de Nemours; (6) polyamide material, e.g., nylon; (7) polyimide material, etc. It is to be noted that some other suitable fiber forming polyesters are described in U.S. Pat. Nos. 2,071,250; 2,465,319; 3,018,272; and 3,671,379, all incorporated hereinto by reference and vrious articles, such as Wilfong, *Journal of Polymer Science*, 54, 385 to 410 (1960), also incorporated hereinto by reference. It is also to be noted that any fiber, man-made or natural, may be employed provided it (1) can be woven or bonded in a regular weave or array, i.e., where the fibers are at 90° to each other or at some angle to one another in a predetermined orderly array, or in a random weave or array, i.e., without a set array or order, and (2) is compatible with a polymer resin composition, e.g., and epoxy-polyester resin, with which it is destined to be impregnated and coated, i.e., the polymer resin composition, e.g., epoxy polyester, does not react therewith and is readily absorbed thereby.

The support 50 may be of any thickness depending upon its ultimate use. However, for printed circuit fabrication a typical, practical thickness has been found to range from 1 to 8 mils.

It is to be stressed at this point that the woven or bonded web 50 is selected for printed circuit manufacture to provide a suitable flexible base. However, such a web has certain mechanical limitations such as dimensional and thermal stability, especially organic fiber containing webs such as polyester, polyimide webs, etc., which have to be improved. Accordingly, the fabric or textile support 50 is treated, by any conventional means, e.g., by dipping, spraying, vacuum impregnating, etc., with a suitable impregnating polymer resin, e.g., an epoxy-polyester resin, in liquid form (uncombined or combined with a solvent carrier medium), maintained in an uncured state or in a partial cure state, whereby (1) the fibers 51 thereof absorb the resin and (2) the polymer resin fills the interstices 52 between the fibers 51 to fully impregnate the support 50 along its entire thickness. It is to be noted that the viscosity of the partially cured epoxy-polyester resin composition (liquid or solution thereof) is not critical; however, it must be such as to fully impregnate the support 50 throughout its entire thickness and form a continuous coating or layer thereover. The viscosity is, of course, dependent on the resin composition employed and its state of cure; the liquid carrier thereof, if employed; and the temperature of application, etc.; i.e., on factors which are well known to one skilled in the art and which are capable of variation by one skilled in the art to achieve a desired viscosity.

The choice of polymer resin will depend upon the use to which the resultant structure is to be put. A typical resin which may be employed comprises a diglycidyl ether of bisphenol A produced by a condensation reaction between bisphenol A and epichlorohydrin, having a general structural formula of

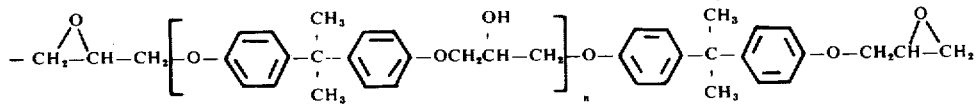

where $n$ is the number of repeated units in the resin chain. Some typical diglycidyl ethers of bisphenol A-epichlorohydrin resins include (1) Epon 562 which is a trademark product of Shell Chemical Company and which is an uncured epoxy (liquid) having an epoxide equivalent weight (number of grams of resin containing one gram equivalent of epoxide) of 140 to 165 and an average molecular weight of 300; (2) Epon 815 which is a trademark product of Shell Chemical Company and which is an uncured epoxy (liquid) having an epoxide equivalent weight of 175 to 210 and an average molecular weight of 340 to 400; (3) Epon 820 which is a trademark product of Shell Chemical Company and which is an uncured epoxy (liquid) having an epoxide equivalent weight of 175 to 210 and an average molecular weight of 350 to 400; (4) Epon 828 which is a trademark product of Shell Chemical Comapny and which is an uncured epoxy (liquid) having an epoxide equivalent of about 190 and an average molecular weight of 350 to 400; (5) Epon 834 which is a trademark product of Shell Chemical Company and which is an uncured epoxy (liquid) having an epoxide equivalent weight 225 to 290 and an average molecular weight of 450; and (6) DER 331 which is a trademark product of Dow Chemical Company which is an epoxy resin having an epoxide equivalent weight of 182 to 190and a viscosity of 10,000 to 16,000 cps.

Another typical resin includes a diglycidyl ether of bisphenol F produced by a condensation reaction between bisphenol F and epichlorohydrin, having a general structural formula of

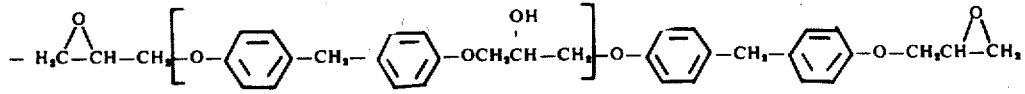

where n is the number of repeated units in the resin.

Other typical resin systems which may be employed are polyester resins, acrylic resins and polybutadiene resins.

A particularly suitable impregnating resin for printed circuit board fabrication is one resulting from a blend or mixture of two combined ingredients. The first ingredient is a branched-chain, acid-terminated polyester of dicarboxylic acid, dihydroxy alcohol and either a polyhydric alcohol having at least three nontertiary hydroxyl groups or a polybasic acid having at least three carboxyl groups, not more than one-half of the total of the acids and alcohols contain aromatic rings. In other words, not more than one half of the monomeric residues of acid and alcohol making up the polyester include aromatic rings.

The polyester contains an average of 2.1 to 3.0 carboxyl groups per molecule, has an acid number of 15 to 125 and a hydroxyl number of less than 10. Accordingly, its number average molecular weight $\overline{M}n$ is 1500 to 17,000 calculated from its number average degree of polymerization $\overline{X}n$ of 10-100. Its skeletal chain is essentially free from ethylenic unsaturation and preferably also essentially free from ether oxygen.

The second ingredient is an epoxy compound containing on the average at least 1.3 groups readily reactive with the carboxyl groups, at least one of which groups is the oxirane group, said groups being separated by a chain of at least two carbon atoms, the chain being free from ethylenic unsaturation.

Some suitable polyesters are those revealed in U.S. Pat. No. 3,027,279, issued Mar. 27, 1962, which is incorporated by reference hereinto. Specifically, the polyesters are:

1. Polyester A, which is formed by a hot melt fusion process in an inert atmosphere using a three-neck glass flask fitted with stirrer, thermometer, gas inlet tube and barret trap. Between the flask and the barret trap is a steam-heated column packed with glass helices. The flask is charged with 133 grams (0.8 mole) of isophthalic acid, 323 grams (1.6 moles) of "Isosebacic acid," 137 grams (1.8 moles) of propylene glycol, 19 grams (0.2 mole) of glycerol and 0.6 gram of triphenyl phosphite as catalyst. "Isosebacic acid" is a product of U.S. Industrial Chemical Co., a division of National Distillers and Chemical Co., consisting by weight of 72 to 80% 2-ethylsuberic acid, 12 to 18% 2,5-diethyladipic acid, and 6 to 10% n-sebacic acid.

The temperature is slowly raised to 230°C, with the water of condensation which begins to form at 130°C removed continuously by a stream of nitrogen. After more than 2 hours, when little water is being removed, a vacuum is applied to reduce the pressure to less than 10 mm. of mercury for an additional hour with continued heating at 200° to 230°C. The reaction is discontinued when the acid number reaches 63. The polyester has a number average molecular weight of 4,600 calculated from a number average degree of polymerization of 20, and contains an average of about 3.0 carboxyl groups per molecule. The viscosity of the polyester at 65°C is 40,000 centipoises. Its equivalent weight based on carboxyl groups is 890;

2. Polyester B, which is formed by charging a 170 gallon stainless steel kettle, equipped with a cooled column packed with Berl saddles leading to a condenser, with 547 pounds of adipic acid, 224 pounds of isophthalic acid, 317 pounds of propylene glycol, 43 pounds of trimethylolpropane and 768 grams of triphenyl phosphite. The temperature is slowly raised using a heated oil bath to 230°C and heating is continued for several hours, during which time the water of condensation is removed by a stream of nitrogen, until the acid number reaches 80. A vacuum of 10 mm. or below is applied, otherwise continuing the same reaction conditions, until an acid number of 55 is reached. This branched-chain, acid-terminated Polyester B has a hydroxyl number of 1.0, a number average molecular weight of 6,000 calculated from a number average degree of polymerization of 30, and contains an average of 3.0 carboxyl groups per molecule;

3. Polyester C, which is prepared in the manner of Polyester A using 1,416 grams (7.0 moles) of "Isosebacic acid," 399 grams (5.09 moles) of propylene glycol, 85.2 grams (0.64 mole) of trimethylolpropane and 2.9 grams of triphenyl phosphite. It has an acid number of 62, a number average molecular weight of 4,800 calculated from a number average degree of polymerization of 20, and contains an average of about 3.0 carboxyl groups per molecule. The bulk viscosity of the polyester is 56,500 centipoises at 23°C;

4. Polyester D, which is prepared from 2.0 moles "Isosebacic acid," 1.3 moles neopentyl glycol, 0.17 mole of trimethylolpropane and 0.2% (based on total charge) of paratoluene sulfonic acid as catalyst by the same procedure as Polyester A. It has an acid number of 125, a number average molecular weight of 2,600 calculated from a number average degree of polymerization of 10, and contains an average of 2.5 carboxyl groups per molecule;

5. Polyester E, which is prepared by reacting a mixture of 596 grams (4.08 moles) of adipic acid, 983.5 grams (5.92 moles) of isophthalic acid, 687.2 grams (9.03 moles) of propylene glycol, 43.2 grams (0.32 moles) of trimethylolpropane and 2.3 grams triphenyl phosphite, as in the preparation of Polyester A, to an acid number of 27. The hydroxyl number is 4, number average molecular weight is about 12,000 calculated from a number average degree of polymerization of about 60, and there is an average of 3.0 carboxyl groups per molecule. The equivalent weight based on carboxyl groups is 2,060, and the viscosity of an 85% solids toluene solution is 16,000 centipoises at 60°C; and (6) Polyester F, which is prepared by reacting a mixture of 505 grams (2.5 moles) of "Isosebacic acid," 415 grams (2.5 moles) of isophthalic acid, 308 grams (4.0 moles) of propylene glycol, 40 grams (0.30 mole) of trimethylolpropane and 1.2 grams triphenyl phosphite, as in the preparation of Polyester A, to an acid number of 55.5. The hydroxyl number is 4, number average molecular weight is 6,800 calculated from a number average degree of polymerization of 30, and there is an average of 3.0 carboxyl groups per molecule. The equivalent weight based on carboxyl groups is 1,010.

Another suitable polyester comprises the reaction product of 24 moles of isophthalic acid

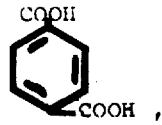

21 moles of 2-ethyl-1,3-hexanediol

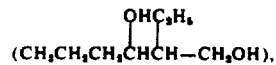

and one mole of trimethylolpropane

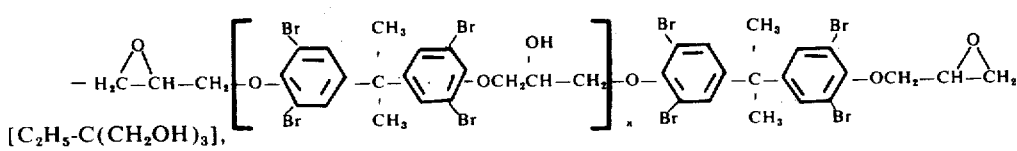

[C₂H₅-C(CH₂OH)₃], which is reacted in a similar manner to the suitable polyesters described above and in U.S. Pat. No. 3,027,279 to yield a trifunctional acid terminated polyester having the structural formula

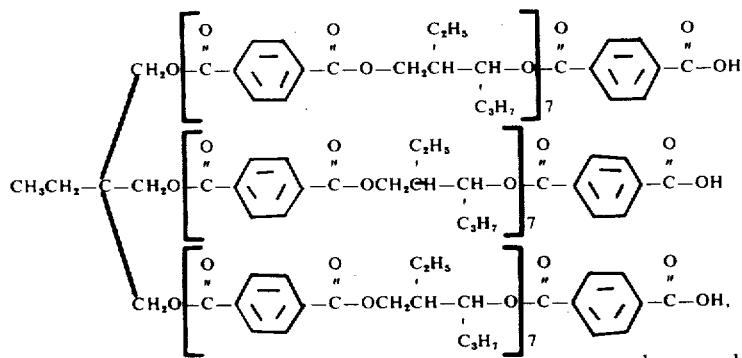

and a number average molecular weight Mn of about 6500.

Other suitable acid-terminated, branched-chain polyestes may be employed. Among dicarboxylic acids which can be used in making these polyesters, other than the acids specifically mentioned above, are o-phthalic acid, azalaic acid and chlorendic anhydride. Among other dihydroxy alcohols which can be used are 1,4-butane diol and ethylene glycol and 2,2-bis [2-hydroxy-propoxy)-phenyl] propane. Another suitable dihydroxy alcohol is 2,2-bis[4-(2-hydroxy-propoxy)-phenyl] propane. In addition to glycerol and trimethylolpropane as the polyfunctional compound, pentaerythritol can be used and polycarboxylic acids such as trimesic acid, citric acid, trimellitic acid, benzene tetracarboxylic acid and tricarballylic acid also have utility.

Some suitable epoxies for combination with the polyester ingredient include diglycidyl ethers of resorcinol and bisphenol-A, some typical examples being commercially available epoxy resins such as those of Shell Chemical Company and designated as:

1. "Epon 1310," which is understood to be the condensation product of 1,1,2,2-tetrabis (4-hydroxyphenyl) ethane and epichlorohydrin having an average of about three glycidyl ether groups in the molecule;

2. "Epon 828," which is a solid epoxy resin condensation product of epichlorohydrin and bisphenol A having a Durran's softening point of about 10°C and an epoxide equivalent weight of about 190 (epoxide equivalent weight is defined as the number of grams of resin containing one gram equivalent of epoxide);

3. "Epon No. 1,001," which is a solid epoxy resin condensation product of epichlorohydrin and bisphenol A having a Durran's softening point of about 70°C and an epoxide equivalent weight of about 490; and 4. "Epon No. 864," which is a solid epoxy resin condensation product of epichlorohydrin and bisphenol A having a Durran's softening point of about 43°C and an epoxide equivalent weight of about 345. It is to be understood that brominated diglycidyl ethers, e.g., one resulting from reacting a brominated bisphenol-A with epichlorohydrin, are also suitable epoxies. Such epoxies have a typical general structural formula of

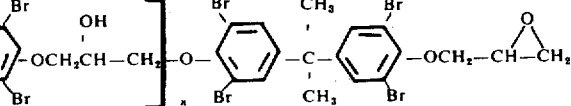

where n = the number of repeated units.

Another suitable epoxy compound is N-(2,3-epoxypropyl)-2-ethylaziridine obtained by interacting 1,2 butyleneimine and epichlorohydrin. Epoxidized novolacs, such as the resin marketed by the Borden Company as "Epiphen 849," are also suitable; as well as monomeric polyepoxides such as limonene dioxide, dicyclopentadiene dioxide, vinylcyclohexene dioxide and 3,4-epoxy-6-methylcyclohexyl methyl-3,4-epoxy-6 methylcyclohexanecarboxylate.

The suitable uncured or partially cured resin impregnated support 50 is then subjected to a curing treatment whereby the resin, e.g., the epoxy-polyester blend described above, is cured to a full cure state. By a full cure is meant that the resultant cured polymer resin, e.g., epoxy polyester, has been optimized, to the extent possible, with respect to at least one of the properties such as electrical properties, mechanical properties or chemical resistance, i.e., with respect to criteria which are well known in the art and are easily ascertainable experimentally by one skilled in the art. For epoxy-polyester resins, by a full cure is meant that the cured epoxy-polyester reaction product, resulting from the interracting and the curing of the suitable epoxy compound and the suitable polyester, is in such a state or condition that a maximum of 1 to 2 weight percent thereof may be removed by soaking in a suitable solvent, such as toluene, for 24 hours at room temperature (25°C). Other indicia of full cure for the epoxy-polyester reaction product is a dissipation factor (electrical) of 0.008 to 0.01 at 400 Hz and 0.006 to 0.0085 at 1,000 Hz (at 23°C and 45% relative humidity).

The methods of cure and conditions are those well known in the art or can be easily ascertained experimentally by one skilled in the art to achieve the degree of cure desired. For example, where epoxy resins are employed, reference is generally made to *Epoxy Resins - Their Application and Technology*, H. Lee and K. Neville, McGraw Hill Book Company, Inc. (1957). Specifically, for the epoxy-polyester resins, the curing steps and conditions are similar to those revealed and discussed in U.S. Pat. No. 3,027,279 and incorporated by reference hereinto. The full cure is accomplished by heating the uncured or partially cured epoxy-polyester blend for a period of time sufficient to attain the optimization of chemical properties. The temperature for attaining this full cure may vary, a preferred minimum being 100°C. At high temperatures, the heating period is short, while at lower temperatures, the heating period is longer. Typically, at a temperature of 150° to 200°C the epoxy-polyester blend is heated for a time period ranging from 10 minutes to several hours, whereby a full cure is obtained. It is to be understood that the time-temperature parameters for attaining a full cure are all interdependent and that variations in time or temperature will produce variations in the other parameter whereby optimum results will be obtained. In this regard, the various parameters of attaining a full cure are well known in the art and their interaction between one another is also well known or can be easily ascertained experimentally by one skilled in the art.

It is, of course understood, that a conventional technique, employing an agent which catalyzes the reaction between the epoxy compound and the carboxyl groups of the polyester compound, may be utilized in the curing of the resultant epoxy-polyester resin. Expecially suitable are tertiary amines and salts thereof, which are combined with the epoxy and polyester in an amount ranging from 0.1 to 5 weight percent of the total combination.

After the curing treatment in which the polymer resin, impregnating the web or support 50, is cured to a full cure stage, the web 50 is coated with a liquid coating polymer resin to form an uncured or partially cured resin layer 53. The resin layer 53 may comprise the same polymer resin composition employed to impregnate the support 50 or it may comprise a different polymer resin composition. Preferably, the polymer resin composition comprises the epoxy-polyester resins described above and in U.S. Pat. No. 3,027,279.

To attain an improvement of the fibrous web or support 50 with respect to dimensional and thermal stability, as well as to attain such improvement in a resultant printed circuit board substrate, (without loss in adhesion of a metal pattern deposited thereon), the resin layer 53 is subjected to a curing treatment whereby the resin contained therein is cured to a state of partial cure. Where epoxy-polyester resins are employed, a partial cure represented by toluene extractables of 7 to 11 weight percent after 24 hours at 25°C is necessary to achieve the desired improvement with desired adhesive properties. Other indicia of this particular partial cure for the epoxy-polyester resins is a dissipation factor of 0.0165 to 0.0208 at 400 Hz and 0.0138 to 0.0170 at 1000 Hz (23°C, 45% relative humidity).

It is also to be noted and stressed at this point that with the above-described partial cure stage of an epoxy-polyester coat 53, a maximum peel strength, desired for printed circuits, for electroless deposited metal, e.g., copper, and an electroplated metal, e.g., copper, is obtained.

Upon partially curing the layer 53, a polymeric substrate or laminate 60 is obtained, having an internal woven or bonded fabric or textile skeleton or support (fibrous) 50 impregnated with a fully cured polymer resin (representing a fully cured core region) coated with a partially cured resin layer or coat 53 (representing a partially cured resin region).

Figure 2:
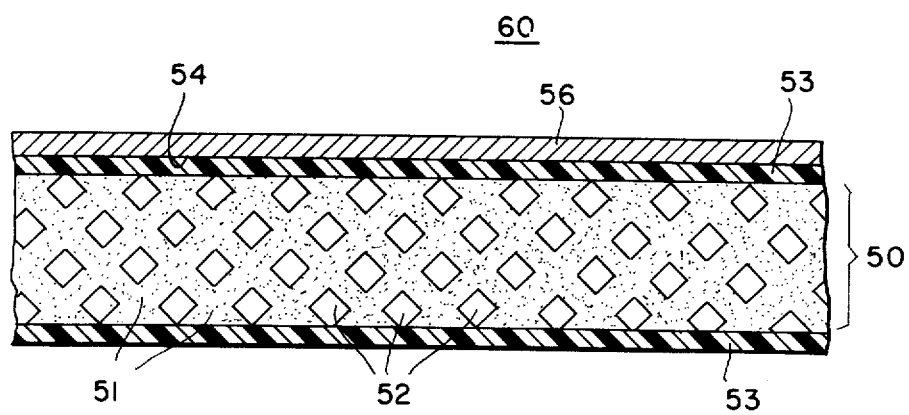
FIG. 2 is a partial cross-sectional view of the laminar structure of FIG. 1 having a metal layer on at least a portion thereof.

A suitable selected species is then deposited on a surface 54 of the partially cured resin coat 53. A suitable species may include any of a multitude of materials well known in the art which can be deposited upon a polymer surface such as an epoxy-polyester surface and comprises, in part, conventional aqueous or organic-based paints, lacquers, inks and adhesives, aqueous or non-aqueous solutions of inorganic salts, aqueous or non-aqueous electroless metal deposition solutions and the metal deposits resulting therefrom, metals, etc. The suitable species may be deposited or applied to the resin surface 54, e.g., epoxy-polyester surface, by any standard means known in the art including dipping, brushing, spray coating, spin coating, vapor depositing, electroless depositing with or without electrodepositing, sputtering, etc. The species-deposited polymeric substrate 60, e.g., an epoxy-polyester substrate, may then be subjected, if desired, to a final curing step whereby the partially cured resin layer 53 is fully cured, resulting in a very adherent species-deposited resin surface.

Where the selected species is an electrolessly deposited metal, a standard electroless technique may be employed. Referring to FIG. 2, the resultant polymeric laminate or substrate 60 having an internal woven or bonded fabric or textile skeleton 50 is subjected to a conventional electroless metal process. The resin surface 54, e.g., an epoxy-polyester surface, may be first etched as for example with $H_2SO_4$, $CrO_3$, $Cr_2O_7$, etc., followed by water rinsing and neutralization with a basic compound, e.g., NaOH and then rinsed with water. Proper rinsing is important so as not to contaminate a sensitizing, an activating and an electroless plating solution to which the surface 54 is destined to be subjected. Contamination, particularly of the plating bath, is undesirable because the stability of such plating baths is frequently adversely affected by such a condition.

After rinsing, the surface 54 is sensitized. Sensitization comprises depositing, on the surface 54, a sensitizing species which is readily oxidized, e.g., $Sn^{+2}$ ions. Conventionally, the rinsed surface 54 is dipped into a standard sensitizing solution, e.g, comprising aqueous stannous chloride with a supporting medium such as HCl, ethanol, ethanol and caustic, or ethanol and hydroquinone. It is to be understood that the sensitizing solutions and the conditions and procedures of sensitizing are well known in the art and will not be elaborated herein. Such sensitizers and procedures may be found in part in *Metallic Coating of Plastics*, Howard Goldie, Electrochemical Publications Limited, 1968.

After sensitizing the surface 54, the sensitized surface is rinsed, then activated. It is to be noted that it is important that the sensitized surface be rinsed thoroughly in a cleaning medium, e.g., water, after sensitizing to remove excess sensitizer. If such is not done, excess sensitizer on the surface may cause reduction of an activating species to which the sensitized surface is destined to be exposed, in non-adherent form on the surface. Activation relates to providing a deposit of a catalytic metal, e.g., Pd, over the surface of the polymer, in sufficient quantities to successfully catalyze a plating reaction once the activated surface is introduced into an electroless plating bath. The sensitized surface is exposed to the activating solution, containing an activating metal ion, e.g., a noble metal ion. The sensitizing species, e.g., $Sn^{+2}$, is readily oxidized therein and the noble metal ion, e.g., $Pd^{+2}$, is reduced to the metal, e.g., Pd, which in turn is deposited on the surface 54. The deposited activating metal, e.g., Pd, acts as a catalyst for localized further plating. Again, it is to be understood that the various activating metal ions and their solutions and the conditions and procedures of activation are well known in the art and will not be elaborated herein. Such activators and prcedures may be found in part, in *Metallic Coating of Plastics*, previously referred to.

After the activating step, the activated surface is immersed in a standard electroless plating bath containing a metal ion. e.g., $Cu^{+2}$, destined to be reduced by the catalytic metal species, e.g., Pd. The metal ion, e.g., $Cu^{+2}$, is reduced by the catalytic metal, e.g., Pd, and is electrolessly deposited on the surface 54 to form a metal deposit 56. Again it is to be pointed out that the electroless baths, the electroless plating conditions and procedures are well known in the art and will not be elaborated herein. Reference is again made to *Metallic Coating of Plastics*, previously referred to, for some typical examples of electroless baths and plating parameters. It is to be noted that in some cases, it is possible to go directly from the sensitizing step to the electroless plating solution exposure step. The electroless metal deposit 56 may then be subjected to a conventional electroplating treatment to build up the metal deposit. It is, of course, understood that the electroplating step is optional and can be eliminated. The metal-deposited substrate or support 50 may then be exposed to the final curing step previously discussed, whereby an adherent metal deposit 56 is obtained.

A preferred method of electrolessly depositing a metal on the polymer surface 54 is the method revealed in U.S. Pat. No. 3,562,005, assigned to the assignee hereof and incorporated by reference hereinto. Simply, the preferred method entails applying a photopromoter solution to the partially cured resin surface 54 (which may have been etched), utilizing procedures revealed in U.S. Pat. No. 3,562,005. A photopromoter is defined as a substance which, upon being exposed to appropriate radiation, either (a) dissipates chemical energy already possessed thereby or (b) stores chemical energy not previously possessed thereby. When the substance possesses or has stored chemical energy it is capable of promoting, other than as a catalyst, a chemical reaction whereby it, the photopromoter, undergoes a chemical change in performing its function (unlike a catalyst). The resultant photopromoter-covered surface may then be rinsed with water (depending on the type of photopromoter employed) and is then dried. After drying, the photopromoter surface is selectively exposed to a source of ultraviolet radiation, through a suitable mask, to form at least one region which is capable of reducing a precious metal from a precious metal salt, e.g., $PdCl_2$. The region so capable is then exposed to the precious metal salt, e.g., $PdCl_2$, whereby the precious metal salt is reduced to the precious metal, e.g., Pd, which in turn is deposited thereon. The precious metal-deposited region may then be rinsed with water and is then exposed to a suitable electroless metal plating bath, e.g., copper, wherein the metal, e.g., copper, is plated on the region forming the metal deposit 56 on the surface 54.

A suitable photopromoter solution may be either a positive type or a negative type as discussed in U.S. Pat. No. 3,562,005. A suitable mask, either positive or negative depending on whether the photopromoter is positive or negative, is one as discussed in U.S. Pat. No. 3,562,005, and typically comprises a quartz body having a radiation opaque pattern thereon. The ultraviolet radiation source is a source of short wavelength radiation (less than 3,000A, and typically about 1,800A to about 2,900A). The metal-deposited surface 54 may then be exposed to a final cure, whereby the resin layer 53 is fully cured, and whereby an adherent metal deposit is retained on the surface 54.

It is to be noted that the invention disclosed herein is employed in the production of electrical circuit patterns on a non-conductive substrate. In this regard, referring to FIG. 2, the electroless deposit 56 obtained, of course, constitutes a portion of the electrical circuit pattern which may be electroplated to a desired thickness.

EXAMPLES

A. For comparison purposes a plurality of films or webs, ranging from 5 to 8 mils in thickness and comprising random spun bonded polyethylene terephthalate polyester fibers, commercially obtained, were impregnated and coated with a liquid epoxy polyester. The epoxy-polyester resin blend, comprised 17.6 weight percent of epoxy and 82.4 weight percent of polyester. The polyester comprised the reaction product of 24 moles of isophthalic acid, 21 moles of 2-ethyl-1,3-hexanediol and one mole of trimethylolpropane and has a structural formula

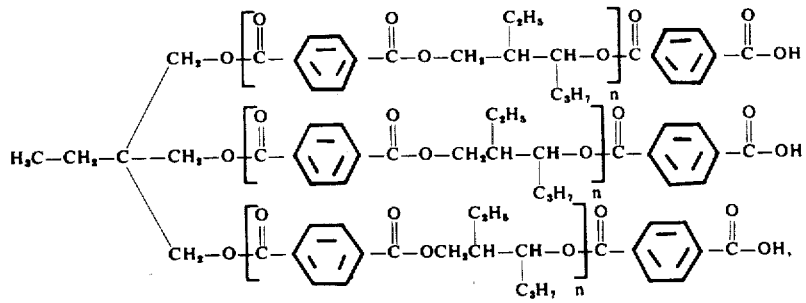

where $n = 7$, and a number average molecular weight Mn of about 6500.

The epoxy compound comprised a condensation product of bisphenol A and epichlorohydrin having a structural formula

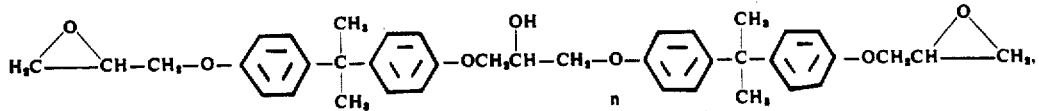

where $n = 1.5$, having an epoxide equivalent weight of about 190 (number of grams of resin containing one gram equivalent of epoxide) and a Durran's softening point of about 10°C.

The resin-impregnated webs were then heated at 150°C for 60 hours to interract the polyester and the epoxy and to obtain a full cure of the resulting product to form 7 to 10 mil thick substrates having an internal fabric skeletal structure impregnated and coated with a fully cured epoxy polyester, as evidenced by one weight percent extractables after immersion in a bath comprising toluene for 24 hours at 25°C.

To determine the thermal stability, one of the resultant substrates (2 inches × 3 inches in dimension) had punched therethrough four location holes forming the corners of a nominal 1 inch square. This permitted both machine direction (MD) and transverse direction (TD) to be compared. The machine direction also corresponded to the polyester fiber orientation. The distance between the holes was measured by means of a commercially available conventional optical comparator. The punched substrate was then exposed to a temperature of 121°C for 72 hours whereafter the distance between holes was measured again and the dimensional change calculated. A growth of 0.2 mil/inch in the machine direction and a growth of 0.4 mil/inch in the transverse direction was obtained.

For printed circuit manufacture a thermal stability (growth or shrinkage) of 1 mil/inch or less can be tolerated.

To determine the adhesive properties of the resultant substrate to a metal deposited on a surface, a surface of one of the resultant substrates was etched in an etchant solution comprising 200 grams per liter of the etchant solution of $Na_2Cr_2O_7.2H_2O$ and 137 ml. per liter of the etchant solution of aqueous $H_2SO_4$ (98 weight percent) for 5 minutes at 60°C. The etched surface was water rinsed for 3 minutes, neutralized by exposure to 10N NaOH for 3 minutes and then water rinsed for 6 minutes.

The etched surface was then sensitized by immersion in a conventional aqueous sensitizing solution, comprising a one liter solution of 10 gms. of $SnCl_2.2H_2O$, 10 ml of concentrated HCl, and remainder of water, for one minute at a temperature of 25°C. The sensitized substrate was water rinsed for 1.5 minutes and then immersed in a 0.01 molar aqueous $PdCl_2$ solution for 1 minute at 25°C. The activated substrate was then immersed in a commercially obtained electroless copper bath to deposit an electroless copper layer on the fully cured epoxy-polyester surface. The electroless copper layer was then subjected to a conventional electroplating to obtain a 1.4 mil thick copper layer, thereby forming a laminar article comprising a metal ($Cu^o$) layer deposited on an epoxy layer. The electroplated, deposited substrate was then heated or baked at 120°C for 1 hour.

A peel strength measurement of the deposited metal was undertaken at a 90° peel at a rate of 2 inches per minute employing a conventional peel testing apparatus. The peel strength was 4 lbs./linear inch at 25°C which is inadequate for printed circuit manufacture.

B. The procedure of Example A was repeated except that the epoxy polyester was cured to a partial cure state evidenced by 6 weight percent extractables in toluene after 24 hours at 25°C (heated at 150°C for 5 hours). The dimensional stability test yielded 1.3 mil/inch shrinkage in the machine direction and 0.6 mil/inch growth in the transverse direction (inadequate for printed circuit manufacture).

A copper deposit, 1.4 mil thick, was obtained having a peel strength of 23 lbs. per linear inch.

C. The procedure of Example A was repeated except that the epoxy polyester was cured to a partial cure state evidenced by 13 weight percent extratables in toluene after 24 hours at 25°C. The dimensional stability test yielded 6.1 mil/inch shrinkage in the machine direction and 10.2 mil/inch growth in the transverse direction (inadequate for printed circuit manufacture).

D. Referring to FIG. 1, the procedure of Example A was repeated with an epoxy-polyester blend comprising 69.2 weight percent of the polyester of Example A. The 30.8 weight percent of the epoxy compound employed, however, comprised the condensation product, obtained by reacting 1.5 moles of tetrabromo bisphenol A with 2.5 moles of epichlorohydrin, having the structural formula

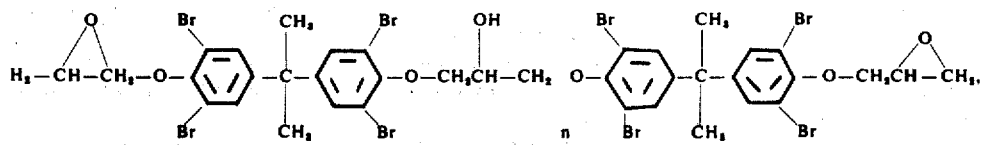

where $n = 1.5$, and having a epoxide equivalent weight of about 592 and an average molecular weight of about 1165 and containing about 51.5 weight percent bromine. Resulting was an impregnated web or support 50 having an internal fibrous skeletal structure impregnated with the fully cured epoxy polyester (one weight percent extractables in toluene after 24 hours at 25°C). The same epoxy-polyester blend was then employed to coat the impregnated support 50 to form a coating resin layer 53 having a thickness of 1.0 mils. The resin layer 53 of the coated support 59 was then partially cured as evidenced by 7.4 weight percent extractables after immersion in a toluene bath for 24 hours at 25°C.

The dimensional stability test yielded 0.3 mil/inch growth in the machine direction and 0.2 mil/inch growth in the transverse direction (acceptable for printed circuit manufacture. A copper deposit, 1.4 mil thick, was obtained having a peel strength of 10 to 14 lbs. per linear inch at 25°C (acceptable for printed circuit manufacture).

An additional test for thermal stability was performed on a second sample which had not been metal deposited. The sample was floated atop hot solder (260°C for 10 seconds). The sample was then examined for shrinkage, blistering and warpage. The sample was acceptable for a printed circuit board using a relative comparison criterion.

E. The procedure of Example D was repeated except that the covering resin layer 53 was cured to a partial cure state evidenced by 8.7 percent extractables in toluene after 24 hours at 25°C.

The dimensional stability test yielded 0.1 mil/inch shrinkage in the machine direction and zero growth or shrinkage in the transverse direction (acceptable for printed circuit manufacture).

A copper deposit, 1.4 mil thick, was obtained having a peel strength of 8 to 15 lbs./linear inch at 25°C (acceptable for printed circuit manufacture).

The solder test yielded a relative comparison number of 19.8 to that in Example D. This sample was suitable for use as a printed circuit board.

F. The procedure of Example D was repeated except that the covering resin layer 53 was cured to a partial cure state evidenced by 9.4 weight percent extractables in toluene after 24 hours at 25°C.

The dimensional stability test yielded 0.4 mil/inch growth in the machine direction and 0.2 mil/inch growth in the transverse direction (acceptable for printed circuit manufacture).

A copper deposit, 1.4 mil thick, was obtained having a peel strength of 9 to 10 lbs./linear inch (acceptable for printed circuit manufacture).

The solder test yielded a relative comparison number of 2.1 to that of Example D. This sample was suitable for use as a printed circuit board.

G. The impregnating procedure of Example A was repeated with the epoxy-polyester resin of Example D. The epoxy polyester was cured to a partial cure state evidenced by six weight percent extractables in toluene after 24 hours at 25°C. The solder test of Example D was then repeated and a relative comparison number of 27 (as compared to Example D) was obtained. This sample was not suitable as a printed circuit board as evidenced by its warpage and blistering.

H. The procedure of Example G was repeated except that the epoxy-polyester was cured to a partial cure state evidenced by 13 weight percent extractables in toluene after 24 hours at 25°C. The solder test yielded a relative comparison number of 39 (as compared to Example D). This sample was not suitable as a printed circuit board as evidenced by its warpage and blistering.

It is to be understood that the above-described embodiments are simply illustrative of the principles of the invention. Various modifications and changes may be made by those skilled in the art which will embody the principles of the invention and fall within the spirit and scope thereof.

What is claimed is:

1. A laminar structure comprising:
   a. an internal skeleton comprising a fabric support impregnated with an epoxy-polyester resin product produced by interreacting (1) a branched-chain, acid-terminated polyester of dicarboxylic acid, dihydroxy alcohol and a polyfunctional compound selected from the class consisting of polyhydric alcohols having at least three nontertiary hydroxyl groups and polybasic acids having at least three carboxyl groups not more than one-half of the total of said acids and alcohols containing aromatic rings, which polyester contains an average of 2.1 to 3.0 carboxyl groups per molecule, has an acid number of 15 to 125, a hydroxyl number of less than 10, and is free from ethylenic unsaturation in its skeletal chain, and (2) an epoxy compound containing on the average at least 1.3 reactive groups readily reactive with the carboxyl group in said polyester, at least one of which reactive groups is the oxirane group, said reactive groups being separated by a chain of at least two carbon atoms, the chain being free from ethylenic unsaturation said epoxy-polyester product being in a stage of full cure; and
   b. a resin layer, on at least a portion of said internal skeleton, comprising said epoxy-polyester resin in (a) above cured to a partial cure stage.

2. The structure as defined in claim 1 wherein said textile support comprises spun bonded polyester fibers.

3. The structure as defined in claim 1 wherein said interreacted polyester comprises at least a polyester having a structural formula of

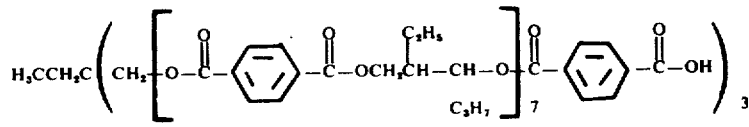

and a number average molecular weight of about 6500.

4. The structure as defined in claim 2 which further comprises a metal layer on at least a portion of said resin layer.

UNITED STATES PATENT OFFICE
CERTIFICATE OF CORRECTION

Patent No. 3,934,067          Dated January 20, 1976

Inventor(s) Ira B. Goldman and John F. Hendrickson

It is certified that error appears in the above-identified patent and that said Letters Patent are hereby corrected as shown below:

Column 1, line 32, "enviornment should read -- environment --.
          line 42, "unles" should read -- unless --.
Column 2, line 51, "ethyleneic" should read -- ethylenic --.
Column 3, line 33, "vrious" should read -- various --.
Column 4, line 53, "190and" should read -- 190 and --.
Column 7, line 28, "Mn" should read -- $\bar{M}n$ --.
          lines 30-31 "po-lyestes" should read -- polyesters --
Column 8, line 46, "interracting" should read -- interreacting-
Column 9, line 21, "Expecially" should read -- Especially --.
Column 11, line 2, "prcedures" should read -- procedures --.
          line 59 "Mn" should read -- $\bar{M}n$ --.
          lines 63-65, that portion of the formula which reads:

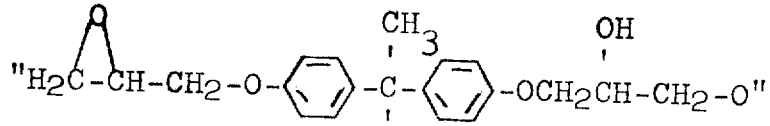

should read

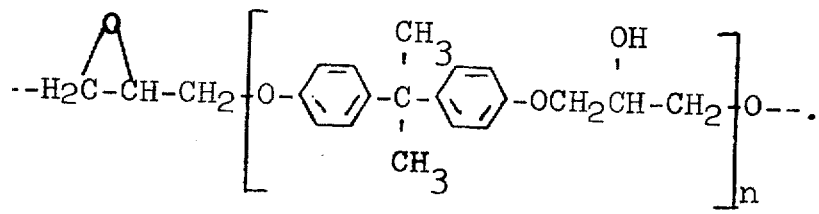

UNITED STATES PATENT OFFICE
CERTIFICATE OF CORRECTION

Patent No. 3,934,067  Dated January 20, 1976

Inventor(s) Ira B. Goldman and John F. Hendrickson

It is certified that error appears in the above-identified patent and that said Letters Patent are hereby corrected as shown below:

Column 14, line 19, "extratables" should read --extractables--; lines 32-38, that portion of the formula which reads:

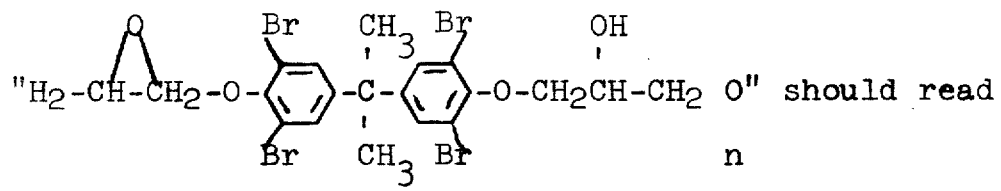

should read

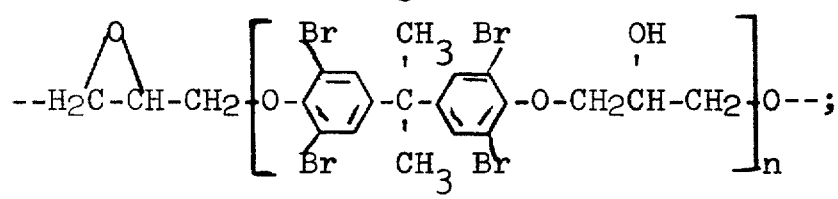

line 42, "a epoxide" should read --an epoxide--; line 52, "support 59" should read --support 50--; line 64, "deposted" should read --deposited--.

In the claims, Column 16, claim 3, lines 42-46, that portion of the formula which reads:

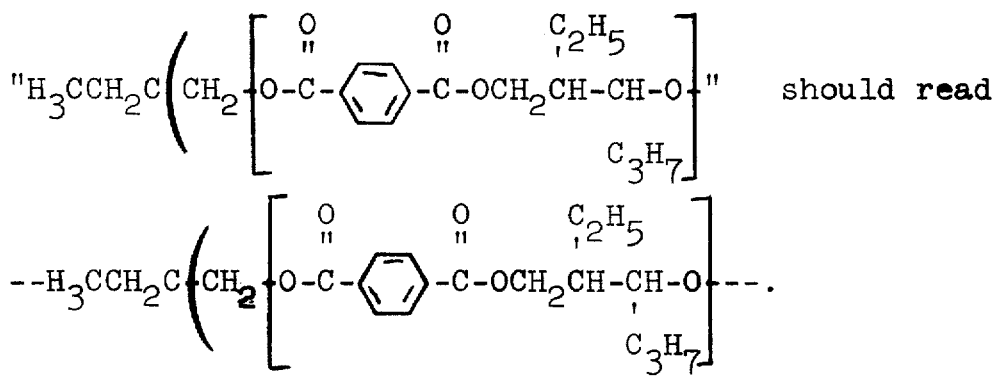

should read

Signed and Sealed this eighth Day of June 1976

[SEAL]

Attest:

RUTH C. MASON
Attesting Officer

C. MARSHALL DANN
Commissioner of Patents and Trademarks